United States Patent
Wu et al.

(10) Patent No.: US 12,210,071 B2
(45) Date of Patent: Jan. 28, 2025

(54) FAULT DIAGNOSIS IN AN ELECTRICITY SUPPLY NETWORK

(71) Applicant: UNIVERSITY COLLEGE CARDIFF CONSULTANTS LTD, Cardiff (GB)

(72) Inventors: Jianzhong Wu, Cardiff (GB); Avinash Aithal, Cardiff (GB)

(73) Assignee: UNIVERSITY COLLEGE CARDIFF CONSULTANTS LTD, Cardiff (GB)

( * ) Notice: Subject to any disclaimer, the term of this patent is extended or adjusted under 35 U.S.C. 154(b) by 465 days.

(21) Appl. No.: 17/284,334

(22) PCT Filed: Oct. 9, 2019

(86) PCT No.: PCT/GB2019/052856
§ 371 (c)(1),
(2) Date: Apr. 9, 2021

(87) PCT Pub. No.: WO2020/074888
PCT Pub. Date: Apr. 16, 2020

(65) Prior Publication Data
US 2021/0349158 A1     Nov. 11, 2021

(30) Foreign Application Priority Data
Oct. 11, 2018    (GB) .................................. 1816580

(51) Int. Cl.
  *G01R 31/42* (2006.01)
  *H02J 3/00* (2006.01)
  *H02J 3/36* (2006.01)
  *H02M 1/32* (2007.01)
(52) U.S. Cl.
  CPC ............ *G01R 31/42* (2013.01); *H02J 3/0012* (2020.01); *H02J 3/0073* (2020.01); *H02J 3/36* (2013.01);
(Continued)

(58) Field of Classification Search
  CPC ...... G01R 31/42; H02J 3/0012; H02J 3/0073; H02J 3/36; Y02E 60/60; Y04S 10/52; H02M 1/32
  See application file for complete search history.

(56) References Cited

U.S. PATENT DOCUMENTS

2005/0280422 A1* 12/2005 Kishibata ............... G01R 31/52
                                                  324/522
2008/0084643 A1*  4/2008 Flottemesch ............. H02J 3/34
                                                  361/93.2
(Continued)

FOREIGN PATENT DOCUMENTS

CN    103592537 A    2/2014
CN    105896476 A    8/2016
(Continued)

OTHER PUBLICATIONS

European Office Action from corresponding European Patent App. No. 197790713.2 dated Feb. 8, 2022, 7 pages.
(Continued)

*Primary Examiner* — Farhana A Hoque
*Assistant Examiner* — Joseph O Nyamogo
(74) *Attorney, Agent, or Firm* — Dinsmore & Shohl LLP (57) ABSTRACT

An SOP for connection to a first feeder in an electricity distribution network, the SOP being configured to, when a feeder connected to the SOP is faulty, apply a diagnostic voltage to the feeder and make current and voltage measurements at the connection of the SOP to the feeder while the diagnostic voltage is being applied.

19 Claims, 7 Drawing Sheets

(52) U.S. Cl.
CPC .............. *H02M 1/32* (2013.01); *Y02E 60/60* (2013.01); *Y04S 10/52* (2013.01)

(56) References Cited

U.S. PATENT DOCUMENTS

| | | | |
|---|---|---|---|
| 2008/0225452 A1 | 9/2008 | Stoupis et al. | |
| 2010/0277137 A1* | 11/2010 | Zhao | H02P 29/0241 322/99 |
| 2012/0300510 A1* | 11/2012 | Jensen | H02J 3/36 363/35 |
| 2015/0137520 A1* | 5/2015 | Garcia | H02J 3/50 290/44 |
| 2015/0295509 A1 | 10/2015 | Thorburn et al. | |
| 2015/0311696 A1* | 10/2015 | Zhu | H02J 3/0012 361/21 |
| 2015/0340859 A1 | 11/2015 | Barker | |

FOREIGN PATENT DOCUMENTS

| | | |
|---|---|---|
| CN | 108183486 A | 6/2018 |
| EP | 2963771 A1 | 1/2016 |
| WO | 2012159652 A1 | 11/2012 |
| WO | 2013083850 A2 | 6/2013 |
| WO | 2015168830 A1 | 11/2015 |
| WO | 2017144114 A1 | 8/2017 |
| WO | 2017178480 A1 | 10/2017 |

OTHER PUBLICATIONS

Patents Act 1977: Search Report under Section 17 for Application No. GB1816580.3 dated Mar. 26, 2019, 10 pages.
Office Action for Chinese Patent Application No. 201980067366.1 mailed Apr. 21, 2022, 26 pages.
Office Action for Chinese Patent Application No. 201980067366.1 mailed Sep. 14, 2022, 38 pages.
Office Action for European Patent Application No. 19790713.2 mailed Sep. 27, 2023, 7 pages.
Office Action for Chinese Patent Application No. 201980067366.1 mailed Feb. 23, 2023, 12 pages.
Office Action for Chinese Patent Application No. 201980067366.1 mailed Jun. 20, 2023, 36 pages.

* cited by examiner

FAULT DIAGNOSIS IN AN ELECTRICITY SUPPLY NETWORK

CROSS REFERENCE TO RELATED APPLICATIONS

The present application is a National Phase Entry of International Application No. PCT/GB2019/052856, entitled "FAULT DIAGNOSIS IN AN ELECTRICITY SUPPLY NETWORK" and filed on Oct. 9, 2019, which claims priority to Great Britain Application No. 1816580.3, entitled "FAULT DIAGNOSTICS IN AN ELECTRICITY SUPPLY NETWORK" and filed Oct. 11, 2018, both of which are incorporated by reference herein in their respective entireties.

FIELD OF INVENTION

The invention is considered within the field of electrical power distribution networks and control of Voltage Source Converters (VSC).

BACKGROUND

The electricity distribution network (i.e. electrical grid) is a system to transmit and distribute electrical power from electrical suppliers (e.g. power stations) to electrical consumers (e.g. large industry or a home). The transmission network of the electrical grid operates at a high voltage, and is used for some transmission and sub-transmission routes. Distribution networks operate at medium voltage and lower voltages and constitute the network supplying the domestic and some commercial consumers.

The network topology is mainly radial, originating from large power stations/producers. Feeders are part of the electricity distribution network and can typically supply about 100 customers. With the advent of renewable technologies such as rooftop solar arrays, customers can now supply power to the electricity distribution grid. Under certain circumstances power flow could flow out from a feeder—this could ultimately cause cable insulation failure or damage transformers and power lines. Thus, the possibility of feeder faults increases with a more distributed electricity supply network.

To protect feeders from faults it is known to have multiple isolating switches (reclosers) along the feeder length, and open points at the end of the feeders, such as a Normal Open Point (NOP). NOPs provide an interconnection with adjacent feeders, and operate like a standard switch that can electrically connect the adjacent feeders to each other.

An alternative to a NOP is a Soft Open Point (SOP). A SOP is a power electronic device usually using back-to-back voltage source converters (VSC) installed in place of a NOP. Unlike mechanically operated switches, such as a NOP, there are no physical opening and closing of contacts in an SOP. Instead the required real power (P) and reactive power (Q) flowing through a SOP is achieved through controlled switching of power electronic switches. Thus, the SOP controls the flow of power between the two adjacent feeders, and is always on. Hence the term, 'Soft' Open Point.

SOPs are typically made from arrangements of VSCs in varying ratings and quantity. There are various topologies of SOPs, however, the main flavours include back-to-back, multi-terminal, and unified power flow controllers (UPFC). A number of studies have been carried out to investigate the effectiveness of SOPs in reducing power losses, balancing feeder loads, and network reinforcements, improving voltage profile, and increased distributed generation connections. However, the majority of these studies focus on the utilisation of SOPs during normal operating conditions of the network. For example, the paper "Performance of an electrical distribution network with Soft Open Point during a grid side AC fault" (Applied Energy 227 (2018), pages 262-272, Avinash Aithal et al) discloses the monitoring of a fault index at an SOP during normal network operating conditions in order to provide for instant detection of an arising fault.

A SOP operating as it would under normal operating conditions behaves like a current source during a fault on the network. The magnitude of current injected from the SOP is limited by the physical current limit of its power electronic switches. However, this current could interfere with existing protection co-ordination (e.g. feeder automation), since protection in distributed networks is largely current based. Therefore, the SOP is typically disconnected from the rest of the electricity distribution network during AC faults.

If a fault occurs on a feeder that is not connected to an adjacent feeder via a NOP or SOP, then hundreds of domestic and/or commercial customers could be left without power while the network operators send someone to investigate and fix the fault.

Feeder automation (FA) is a way of automatically restoring a feeder to an operating state after a temporary fault and redirecting power during a permanent fault. FA schemes improve the restoration time of the network during faults. FA schemes also ensure that the network follows predetermined steps to automatically isolate the faulted section. Power can then be re-routed to the unaffected feeder sections (reconnecting those consumers) through a healthy feeder by closing the NOP, or restarting a SOP.

Historically, FA schemes include switching devices, such as auto-reclosers, along the feeder. In the event of a fault these auto-reclosers detect the fault current flowing through them and open (disconnecting the fault from the rest of the electricity distribution network). Auto-reclosers then blindly attempt to close after a pre-defined period of time. If the fault is temporary then when the auto-recloser closes, the VSC/SOP/NOP resumes normal operation. If the fault persists, the auto-recloser detects the fault current again and re-opens. The auto-recloser then attempts to close again after a further pre-defined period of time. Each reclosing attempt is called a shot, and the fault is considered permanent after a set number of shots.

Disadvantages of this historical feeder automation methodology include the following:
1) There are fixed dead times between attempted reconnections which can result in up to 30 seconds between shots due to physical limitations.
2) The number of shots is a trade-off between the probability of network restoration and asset degradation.
3) The degradation of the auto-reclosers after each shot (they can typically only withstand up to 2500 operations), thus auto-recloser contacts require a lot of maintenance. Other equipment, such as cables, wires, transformers and connectors are also subjected to thermal and mechanical stress during each shot.
4) During each shot there is a voltage sag on adjacent networks, which can be detrimental to the network.

SUMMARY

According to one aspect, the invention provides a soft open point, SOP, for an electricity distribution network comprising a first and second VSCs, and a DC link connecting the two VSCs. Each VSC can be configured to apply voltage corrections to a respective feeder of an electricity distribution network while the feeders are operating normally. The first VSC is configured to, when a first feeder connected to the first VSC is faulty, apply a diagnostic voltage to the first feeder and make current and voltage measurements at the connection of the first VSC to the first feeder while the diagnostic voltage is being applied. In this way, the SOP, which is normally used for applying voltage corrections to the feeder, is repurposed to diagnose a fault on the feeder.

In some embodiments, the first VSC is configured to generate the diagnostic voltage from a DC voltage applied to the DC link, and the second VSC is configured to generate the DC voltage from a voltage picked up from a second feeder to which the second VSC is operatively coupled.

In some embodiments, the SOP includes processing means configured to estimate from the measurements and a per-unit-length impedance or resistance of the first feeder the distance along the first feeder from the point of application of the diagnostic voltage to a fault along the first feeder. The processing means may also or alternatively be configured to determine from the measurements the type of a fault on the first feeder. The processing means may be arranged to, in response to determining that the fault has cleared, send a command for a feeder isolation device to close. The processing means may be arranged to, in response to determining that the fault persists a predetermined time after being detected, send a command for a feeder isolation device to open. In some embodiments, the processing means comprises one or more processors executing instructions retrieved from associated memory. In some embodiments, the controller is external to the SOP.

According to another aspect, the invention provides a method of fault assessment for a feeder in an electricity distribution network. According to the method, supply of a voltage correction to a feeder from a voltage source converter, VSC, of a soft open point, SOP, is ceased. A diagnostic voltage is generated by the VSC and applied to the feeder. At least one voltage measurement is made at the connection of the VSC to the feeder. At least one current measurement is made at the connection of the VSC to the feeder. At least one characteristic of a fault on the feeder is determined from the measurements. In this way, the SOP, which is normally used for applying voltage corrections to the feeder, is repurposed to diagnose a fault on the feeder.

In some embodiments, determining at least one characteristic comprises calculating from the voltage and current measurements the distance along the first feeder from the point of application of the diagnostic voltage to the fault along the feeder. Alternatively or additionally, determining at least one characteristic comprises determining from the voltage and current measurements the type of the fault.

In some embodiments, it is determined from the voltage and current measurements that the fault has cleared and a command for a feeder isolation device to close is sent.

In some embodiments, it is determined from the voltage and current measurements that the fault has not cleared within a predetermined period of being detected and a command for a feeder isolation device to open is sent.

According to another aspect, the invention provides a voltage source converter, VSC, for connection to a first feeder in an electricity distribution network. The VSC is configured to, when a feeder connected to the VSC is faulty, apply a diagnostic voltage to the feeder and make current and voltage measurements at the connection of the VSC to the feeder while the diagnostic voltage is being applied. In this way, a VSC can be repurposed for diagnostic use.

According to a yet further aspect, the invention provides a voltage source converter, VSC, for connection to a first feeder in an electricity distribution network. The VSC comprising a voltage source configured to produce an output voltage, current and voltage sensors, and a controller configured to adjust electrical parameters of the output voltage. The controller is configured to, when a feeder connected to the VSC is faulty, direct the voltage source to apply a diagnostic voltage to the feeder and make current and voltage measurements at the connection of the VSC to the feeder via the sensors while the diagnostic voltage is being applied. In this way, a VSC can be repurposed for diagnostic use.

The diagnostic voltage may be fixed, in the sense that it is magnitude is nominally constant during the process of using the diagnostic voltage to assess a feeder fault.

BRIEF DESCRIPTION OF FIGURES

By way of example only, certain embodiments of the invention will now be described with reference to the accompanying drawings, in which.

DETAILED DESCRIPTION

Figure 1:
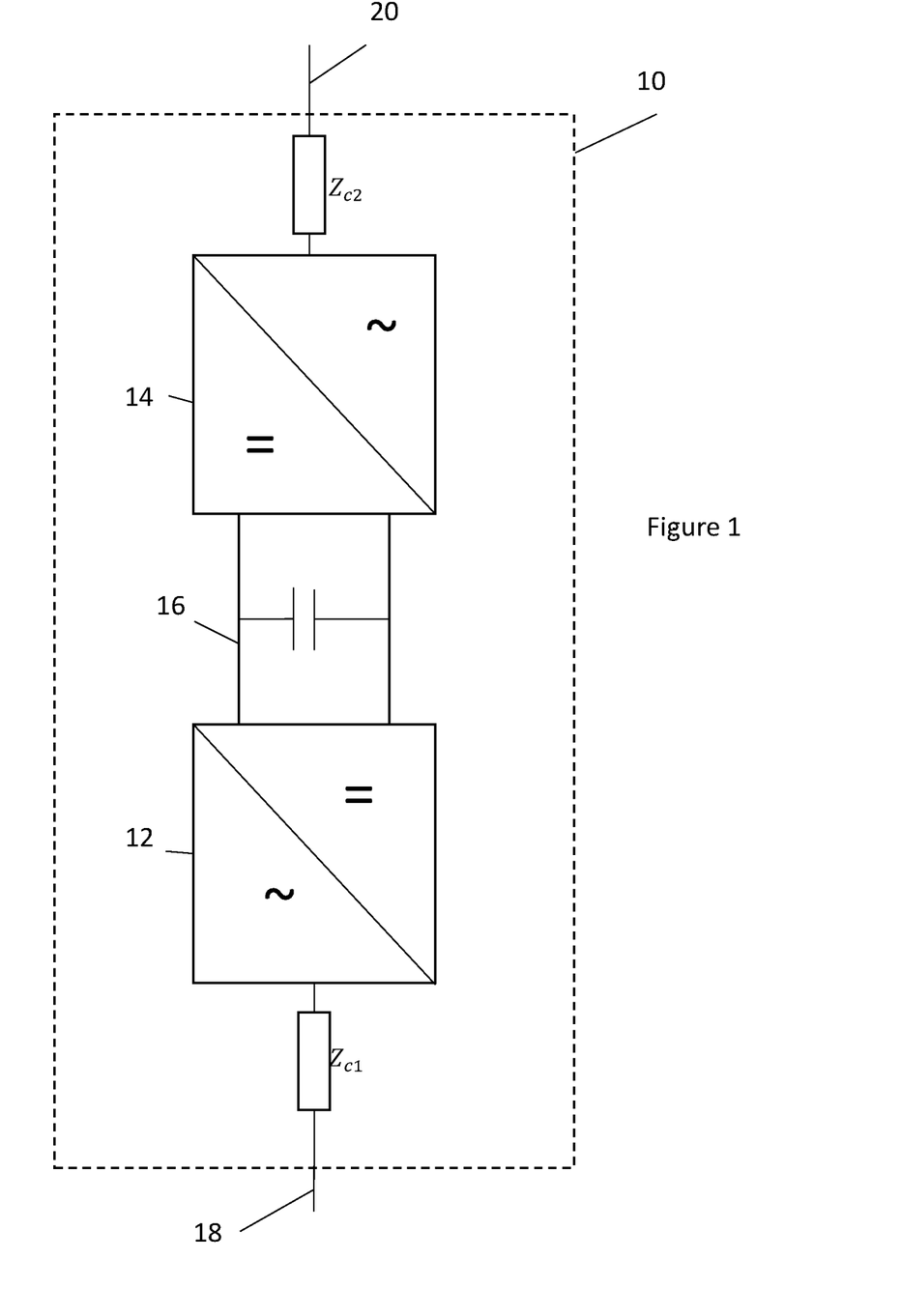
FIG. 1 is a system diagram of a Soft Open Point (SOP)

FIG. 1 shows an example of a Soft Open Point (SOP) 10 which could be connected to feeders. Specifically, SOP 10 is a back-to-back SOP. The SOP 10 comprises two Voltage Source Controllers (VSCs) 12, 14. Each VSC 12, 14 can convert between DC and AC. The two VSCs 12, 14 are connected via a common DC link 16. VSC 12 is connected to the end of a feeder 18, and VSC 14 is connected to the end of a second feeder 20. The internal converter impedances of each VSC 12, 14 are shown as $Z_{c1}$ and $Z_{c2}$ respectively.

Other types of SOPs can also be connected to feeders, such as a multi-terminal SOP, or a unified power flow controllers (UPFC) SOP, but others are possible. Although it is shown in FIG. 1 that SOP 10 comprises VSCs 12, 14.

Figure 2:
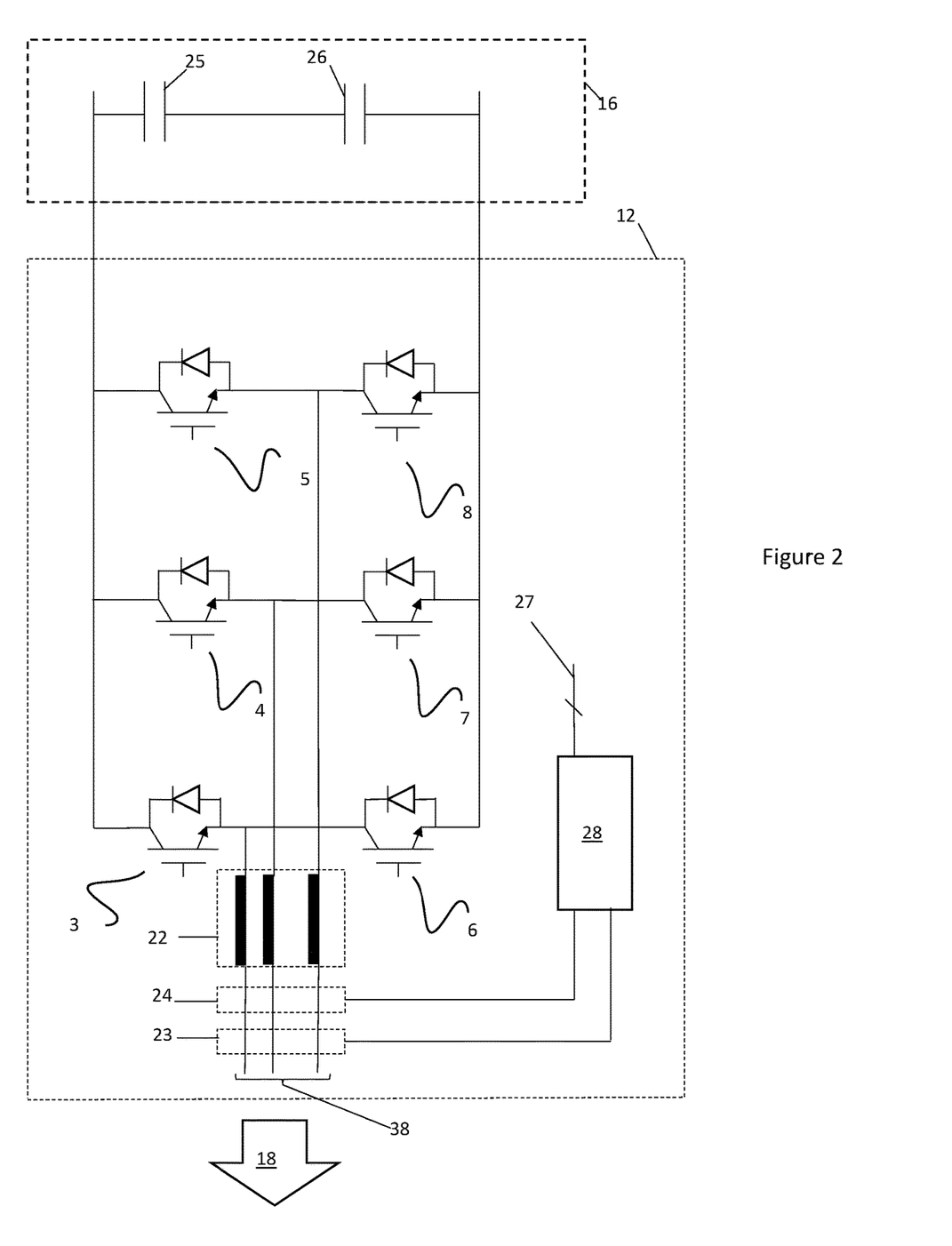
FIG. 2 is a schematic of a Voltage Source Controller (VSC)

FIG. 2 schematically illustrates the architecture of VSC 12. It will be understood that VSC 12 is a two-level VSC. It is common (but not essential) for VSCs in a SOP to be of the same type, thus, VSC 14 is typically also a two-level VSC. Other VSCs can also be used in SOPs, such as multi-level converters. Multi-level converters are common for higher voltage level systems. It can be assumed that, for the purposes of this illustrative and exemplary description, that VSC 14 has the same architecture as VSC 12.

As shown in FIG. 2, VSC 12 has six arms of insulated-gate bipolar transistors (IGBTs), indicated 3, 4, 5, 6, 7 and 8, in a bridge configuration. Two-level VSC 12 could equally have six arms of high-power metal-oxide-semiconductor field-effect transistors (MOSFETs), or the arms might use another type of electronic switching device. The IGBTs 3, 4, 5, 6, 7 and 8 in the arms of VSC 12 are commutated to control the flow of current, this is achieved through pulse width modulation (PWM). Smooth voltages are generated at the VSC 12 terminal using low pass filters 22. Voltage measurements are taken by voltage sensors 23, and current measurements are taken by current sensors 24. The capacitors 25 and 26 limit the DC current ripple in the DC link 16, and can provide for decoupled real power transfer. The VSC 12 can be connected to the feeder 18 through an isolating transformer (not shown). The VSC 14 can be similarly connected to the second feeder 20 through an isolating transformer (not shown).

Ignoring the power losses, the magnitude of real power flowing between the two VSCs 12, 14 is equal during steady state operation. This is illustrated by the power balance Eqn. (1):

$$P_1 = P_2 = P_{dc} = V_{dc} \times I_{dc} \tag{1}$$

where $P_1$ is the real power flowing through VSC 12 and $P_2$ is the real power flowing through VSC 14.

As may also be seen from FIG. 2, the VSC 12 has a controller 28. The controller 28 receives voltage and current measurements from the point of connection between the feeder 18 and the VSC 12, to control the drive signals 27 of the IGBTs 3, 4, 5, 6, 7 and 8. (To avoid cluttering the diagram, the connections delivering the drive signals 27 to the IGBTs 3, 4, 5, 6, 7 and 8 are not shown in FIG. 2.) A number of control schemes will be known to the skilled person, such as the use of linear proportional-integral (PI) controllers to control the sinusoidal network quantities. The controller 28 is capable of controlling parameters such as real power, reactive power, frequency, AC terminal voltage, and DC link voltage. The controller 28 controls these parameters using the drive signals 27.

Figure 3:
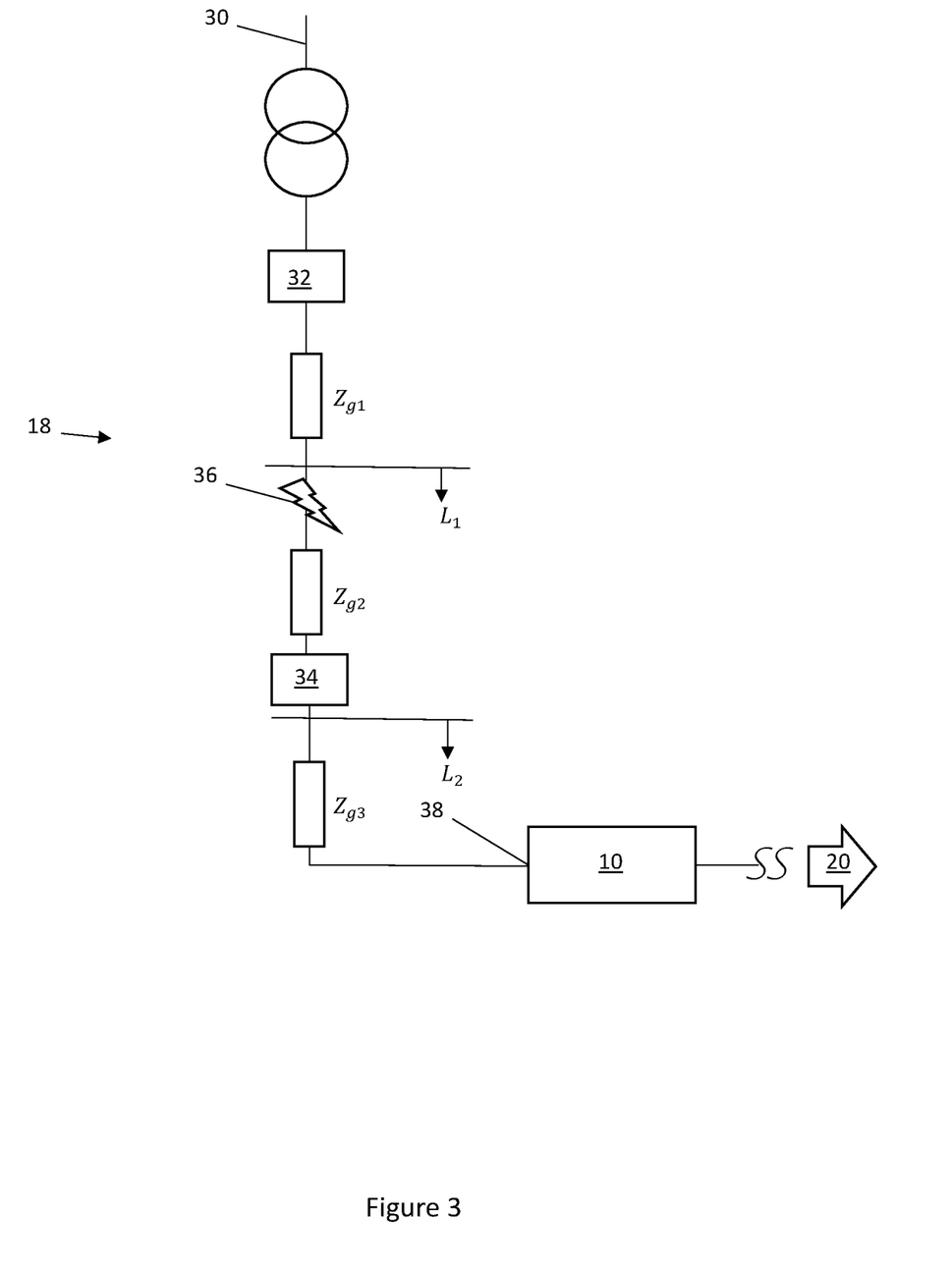
FIG. 3 is a system diagram of a feeder with a fault connected to a SOP.

FIG. 3 shows the feeder 18 in an electricity distribution network connected to the rest of the electricity distribution network at point 30, and to the SOP 10. The feeder 18 shows feeder isolation devices (e.g. reclosers) 32, 34, line impedances ($z_{g1}$, $z_{g2}$, $z_{g3}$), loads $L_1$ and $L_2$, and a fault 36. Alternatively, the feeder 18 can have any number of feeder isolation devices and loads. The line impedances ($Z_{g1}$, $Z_{g2}$, $Z_{g3}$) are quantised representations of the impedance (or resistance) over a unit length of the feeder 18.

VSC 12 can be configured by the controller 28 to operate in at least one of three operational modes; power control mode, diagnostic mode, and/or restoration mode. However, the VSC 12 can only operate in one mode at a time.

The controller 28 operates the VSC 12 in the power control mode during an unfaulted, grid-connected condition. In the power control mode, the VSC 12 controls the flow of power between the feeder 18 and the DC link 16. Thus, the SOP 10 controls the flow of power between the two feeders. To control the flow of power, the controller 28 produces voltage reference signals using the inverse Park's transformation. The voltage reference signals can be used by the controller 28 to generate control signals 27 to fire the IGBTs 3, 4, 5, 6, 7 and 8 to generate the three voltage phases (Va, Vb, Vc) of the VSC 12 at point 38. Control of the power flow reduces the possibility that one feeder has a cable insulation failure caused by too much power in a feeder's cable.

The controller 28 operates the VSC 12 in the diagnostic mode during a fault condition. In a fault condition, the fault 36 is disconnected from the rest of the electricity distribution network by the feeder isolation device 32. In the diagnostic mode, the controller 28 can determine the presence of a fault 36 on the feeder 18, the type of fault 36, and/or the distance along the feeder 18 to a fault 36, from the connection of the VSC 12 to feeder 18.

The feeder 18 voltage under normal operating conditions is roughly the voltage of the electricity distribution network as a whole, and similar to the voltage the VSC 12 generates in the power control mode. In diagnostic mode, the controller 28 of the VSC 12 is configured to apply a diagnostic voltage to the feeder 18. The diagnostic voltage is an attenuated version of the feeder 18 voltage under normal operating conditions. For example, the diagnostic voltage could be 10% of the feeder 18 voltage under normal operating conditions. With the VSC 12 applying a diagnostic voltage it is possible to make current and voltage measurements on the feeder 18 using voltage and current sensors 23, 24 at the connection point 38 of the VSC 12 to the feeder 18.

The diagnostic voltage is used so as to not interfere with existing protection co-ordination, since protection in electricity distribution networks is largely current based. A diagnostic voltage also ensures no physical damage (e.g. wear) to connected components on the feeder 18 (e.g. power electronic switches, devices, etc.).

Phasors and phasor diagrams are a method of describing an AC voltage or a current in terms of its amplitude and its relative phase. For three-phase systems, the three phases a, b, c, can be plotted relative to each other. A three-phase system with three unbalanced phasors can be resolved into three symmetrical components:

Positive Sequence: A balanced three-phase system with the same phase sequence as the original sequence.

Negative sequence: A balanced three-phase system with the opposite phase sequence as the original sequence.

Zero Sequence: Three phasors that are equal in magnitude and phase.

For the three-phase electricity distribution network in a normal operation, there are only positive sequence components, with no negative and zero sequence components, neglecting the imbalance introduced by the load. During a fault 36, the voltage and current phasors of the feeder 18 will be unbalanced and can thus be represented by the three symmetrical components. Negative sequence components are present for unbalanced faults. The zero sequence components exist in the network only if a ground path is available for the flow of currents.

FIG. 3 illustrates the feeder 18 having a fault 36. The VSC 12, of the SOP 10, is operating in the diagnostic mode. Specifically, the VSC 12 connected to the feeder 18 behaves as a voltage source. Therefore, the sequence voltage components (i.e. positive, negative and zero sequence) are quantified to confirm the continued presence of a fault 36. The voltage and current are measured by the controller 28, at points 23 and 24 respectively. The controller 28 uses these voltage and current measurements to calculate the following Fault-Index (FI):

$$FI_x = \frac{(V^p_{x\,RMS} - (V^n_{x\,RMS} + V^z_{x\,RMS}))}{(V^p_{x\,N})} \tag{2}$$

where x represents phase a, b, or c. $V_{x\,RMS}^p$ is the root mean square (RMS) value of positive sequence voltage, and $V_{x\,RMS}^n$ is the RMS value of the negative sequence voltage and $V_{x\,RMS}^z$ is the zero sequence voltage. $V_{x\,N}^p$ is the nominal RMS voltage of the VSC 12 during diagnostic mode.

It is necessary to clearly distinguish between voltage imbalance and a fault. The FI is a ratio that is equal to 1 when there is only the positive component (i.e. no voltage imbalance). In reality there will always be some voltage imbalance depending on the loads and the topology of the electricity distribution network so any threshold to distinguish between voltage imbalance and a fault will be tuned to the deployment environment. However, a value that is considered generally acceptable by the present inventors is $FI_{threshold}=0.9$, and so any value of FI<0.9 may be used to indicate the presence of a fault in the network. This normalized, dimensionless FI is applicable for any network by using the measured sequence quantities and corresponding nominal voltage of the network under consideration. In the diagnostic mode, the controller 28 continuously calculates the fault index to determine whether the fault remains present.

The measured phase voltage and the line current at the grid connection point 38 depends on the type of fault. Each type of fault is uniquely characterised by three conditions of respective phase voltage and line currents. The table below shows the conditions for three types of faults; a) a line-to-ground fault (e.g. '$L_a$-G' when line 'a' is connected to ground); b) a line-to-line fault (e.g. '$L_a$-$L_b$' when line 'a' and line 'b' are connected); c) a three-phase fault (e.g. '$L_a$-$L_b$-$L_c$' when line 'a', line 'b', and line 'c' are connected). Similar equations can be written for faults involving other phases. The apparent positive sequence impedance can be calculated by using the fault-loop applicable for the respective fault type. The fault-loop is a well-known fault analysis method. (An example of fault-loop in literature is in "network protection & automation guide" by Alstom—chapter 5 and chapter 11—Edition May 2011.) The corresponding equations to calculate the $V_g$ and $I_g$ values are shown in Table 1 below.

TABLE 1

Fault determination criteria and respective voltage and currents at grid connection point 38

| Type of Fault | Fault type determination criteria (without loads) | | Voltage and Current at grid connection point 38 | |
|---|---|---|---|---|
| | Voltage conditions | Current conditions | $V_g$ | $I_g$ |
| $L_a$ - G | $V_a = 0$ | $I_a = I_b = 0$ | $V_a$ | $I_a + \left(\dfrac{Z_l^z}{Z_l^p}\right) I_a^z$ |
| $L_a$ - $L_b$ | $V_a = V_b$ | $I_a = -I_b; I_c = 0$ | $V_b - V_c$ | $I_b - I_c$ |
| $L_a$ - $L_b$ - $L_c$ | $V_a = V_b = V_c$ | $I_a + I_b + I_c = 0$ | | |

Figure 4:
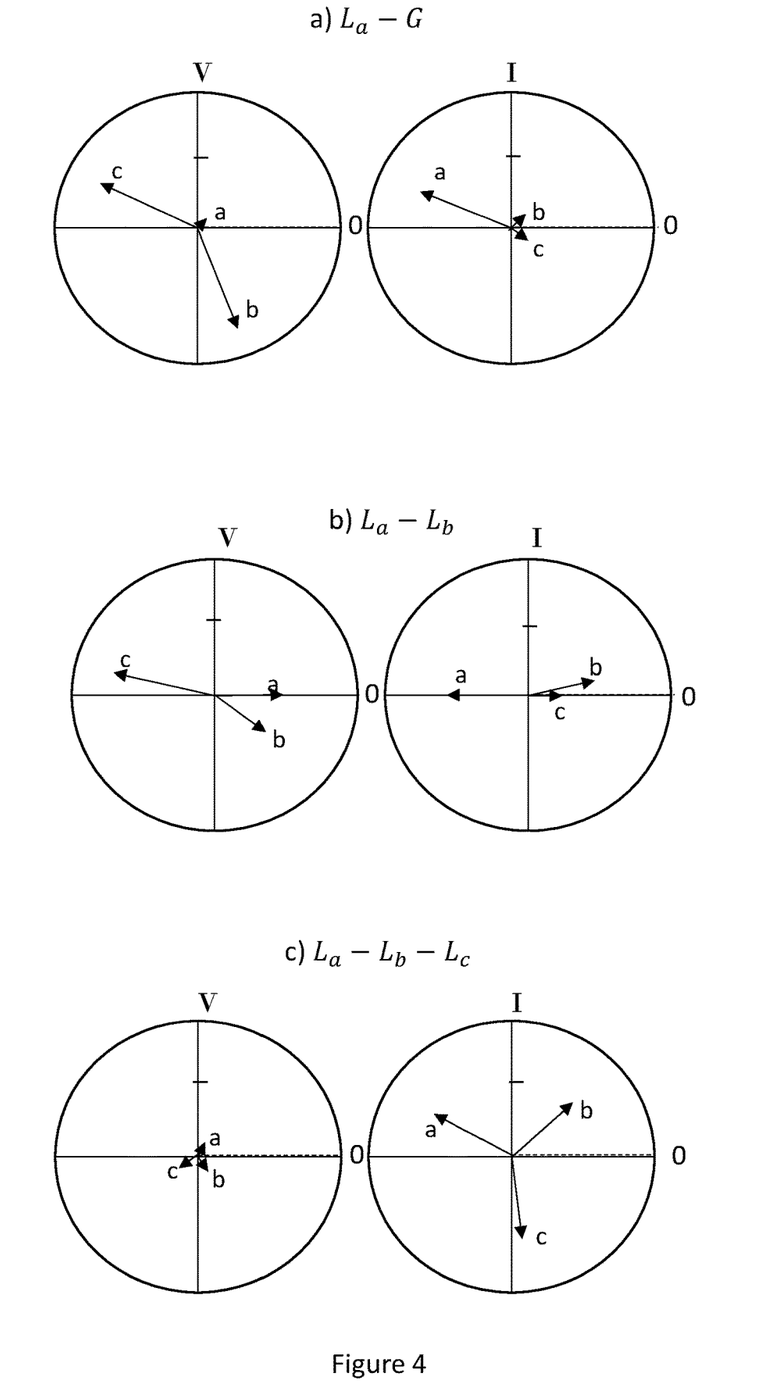
FIG. 4 illustrates three sets of voltage and current phasor diagrams for three types of feeder fault.

In Table 1, the zero sequence line impedance is represented by $Z_l^z$ and positive sequence line impedance is represented by $Z_l^p$. For line-to-ground faults, the phase to neutral voltage is used and the current includes zero sequence components ($I_g^z$). For phase faults, phase to phase voltages and currents are both used. FIG. 4 shows the voltage and current phasors for the three types of faults above in a network with loads not neglected (i.e. a realistic application). The use of threshold values can be used so that Table 1 applies to a realistic application. For example, in FIG. 4, a small enough voltage or current condition could be approximated to zero using a threshold value. Using this technique the type of fault can be calculated using Table 1 above.

In the diagnostic mode, the controller 28 estimates the location of a fault by calculating the apparent impedance of the network with single end measurement (e.g. from sensors 23, 24). Algorithms based on impedance calculation using single end measurement are advantageous since they are simple to implement, do not require any communication or remote data and can deliver reasonably accurate results. FIG. 3 shows an equivalent single line diagram of the feeder 18. $V_g$ and $I_g$ are calculated from the measured phase voltage and the line current at the grid connection point 38 (measured by sensors 23, 24). From $V_g$ and $I_g$ it is possible to calculate the apparent positive sequence impedance $Z_{app}$ of the line between the grid connection point 38 and the fault 36. Using Kirchhoff's law, the impedance seen from grid connection point 38 can be mathematically expressed as shown in Eqn. 3:

$$Z_{app} = \frac{V_g}{I_g} = dZ_{total} + R\frac{I_f}{I_g} \quad (3)$$

From Eqn. 3, the distance to the fault can be calculated by the controller 28. d is the per unit distance of the fault from grid connection point 38 defined with the total feeder length (D) as a base. For example, if the fault is a quarter of the way along the total feeder length, $$d = \frac{1}{4}.$$

The fault current at the location of the fault 36 is represented by $I_f$. The fault resistance is represented by R, and the total feeder impedance is represented by $Z_{total}$.

Other ways of determining fault location are possible and are known to the skilled person in the art, such as the travelling wave method, or a method using digital fault recorders for example.

The VSC 12 operates in the restoration mode when there is a fault 36, and the fault 36 has been isolated from the rest of the electricity distribution network (e.g. by feeder isolation device 32) and from the VSC 12 (e.g. by feeder isolation device 34). The restoration mode is used to resume power supply to the un-faulted out-of-service loads, thus restoring power to some electrical consumers (e.g. large industry or homes). FIG. 3 shows this un-faulted out-of-service load $L_2$ connected to the SOP 10. The controller 28 is then used to generate the converter terminal voltage ($V_a$, $V_b$, $V_c$) through inverse Park's transformation, similar to the power control mode.

The power control mode cannot be used since the voltage of the VSC 12 is no longer dictated by the electricity distribution network. Therefore, the controller 28 implements a strategy to generate and control the terminal voltage and the grid frequency to be within the standard operating range for an un-faulted feeder. The VSC 14 connected to the un-faulted feeder 20 continues to operate in the power control mode; controlling the flow of power between the second feeder 20 and the DC link 16. This is to maintain the DC link voltage as the VSC 12 draws power from the DC link voltage in order to supply the un-faulted out-of-service loads.

Figure 5:
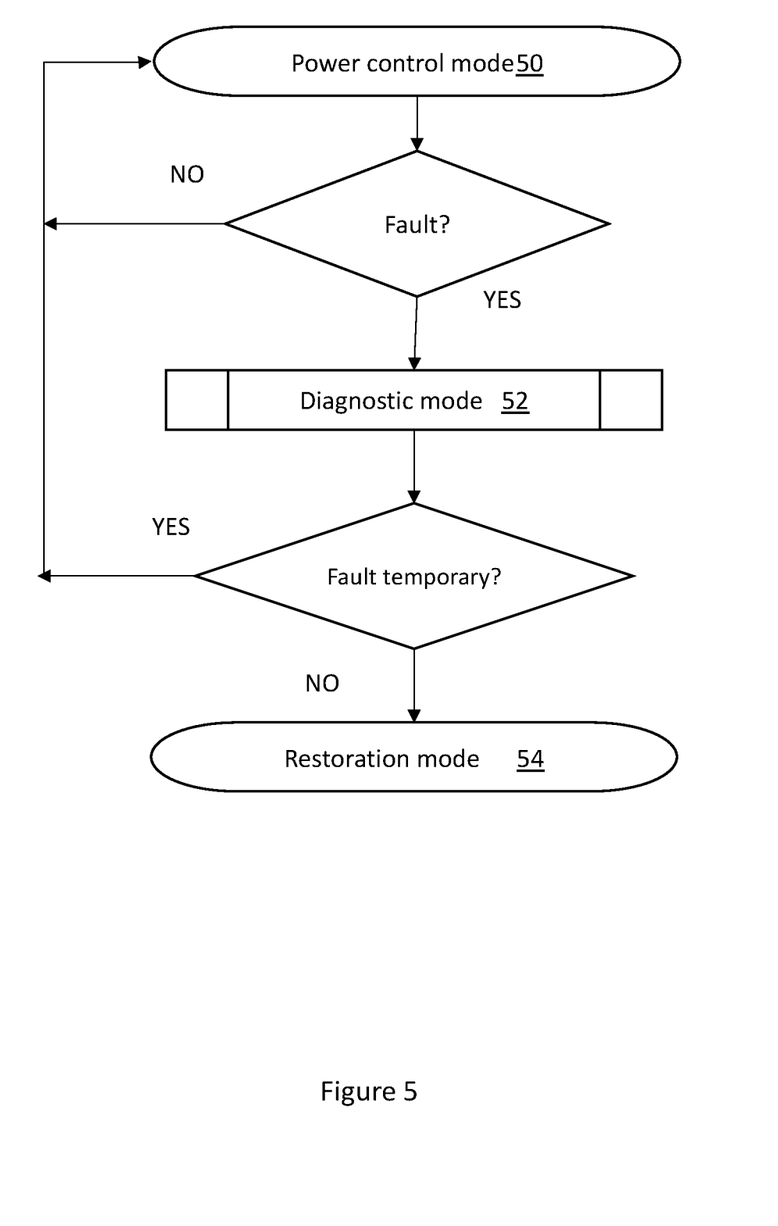
FIG. 5 is a flow diagram of VSC/SOP operation using a diagnostic mode.

FIG. 5 shows a method of operation for the VSC 12 which is capable of operating in a diagnostic mode. When there is no fault on the feeder 18 the VSC 12 (also by extension the SOP 10) operates in the power control mode 50. When a fault 36 occurs, the controller 28 which is continuously processing the Fault Index (FI), indicates that there is a fault 36 on the feeder 18. The VSC 12 then shuts down until the fault has been isolated from the rest of the network. Using the FI, the controller 28 can detect when the fault has been isolated and then changes its operational state to the diagnostic mode 52, and a timer is started. Alternatively, the isolation device can command the VSC 12 to change its operational state to the diagnostic mode 52. If the fault 36 resolves itself (i.e. FI is maintained above the $FI_{threshold}$ continuously for a set number of AC cycles [e.g. 6], called the confirmation time $\Delta T_r$) within a pre-defined duration $\Delta T_p$ (from the start of the diagnostic mode) then the VSC 12 changes operational state back to power control mode 50. $\Delta T_p$ defines the duration for a fault to be considered permanent, and it will be tuned to the deployment environment. A $\Delta T_p$ on the magnitude of seconds (e.g. 20 seconds) can be long enough for any temporary faults to resolve themselves. If the fault 26 is permanent, then the VSC 12 changes operational state to restoration mode 54.

Figure 6:
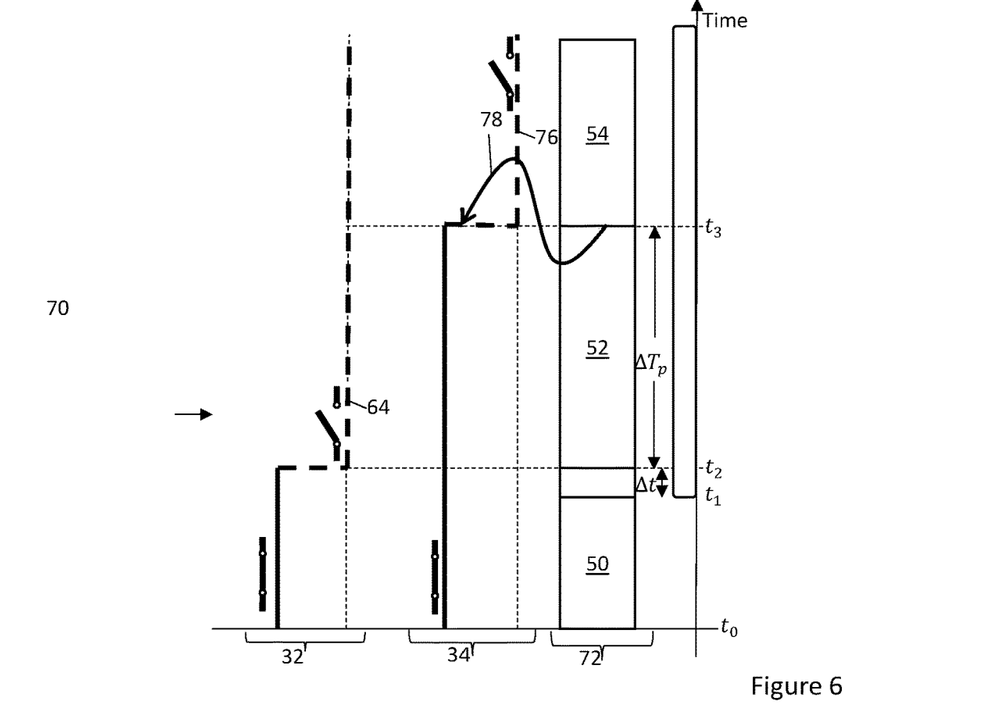
FIG. 6 illustrates a feeder automation scheme using a diagnostic mode for a temporary fault and a permanent fault.

FIG. 6 shows how the method of FIG. 5 can be implemented in the cases of both a temporary fault 60 and permanent fault 70. The feeder isolation device 32 of FIG. 3 is represented in FIG. 6, the feeder isolation device 34 of FIG. 3 is also represented. The graphs 62, 72 corresponds to the SOP 10 mode of operation.

It can be seen in FIG. 6 that the power control mode 50 halts as soon as a fault 36 is detected. After time Δt the diagnostic mode 52 starts, feeder isolation device 32 opens 64, disconnecting the faulty feeder 18 from the rest of the electricity distribution network. If the fault 36 is of a temporary type 60, a command 68 is sent (from controller 28) for the feeder isolation device 32 to close 66, and the power control mode 50 resumes.

If the fault 36 is of a permanent type 70, then after time $\Delta T_p$ from the start of the diagnostic mode 52, a command 78 is sent (from controller 28) for the feeder isolation device 34 to open 76. Thus, isolating the fault 36 so the SOP 10 can operate in restoration mode 54 to reconnect customers that were disconnected due to the fault 36. The isolation of the fault 36 can also allow for further manual investigation and repair, while ensuring the maximum number of customers are connected to the electricity distribution network.

An advantage of a diagnostic mode being used by VSCs and SOPs is that in the event of a fault on a feeder, an improved feeder automation methodology can be implemented.

The main advantages in comparison to the restoration using auto-reclosers include the following:
1) No dead time: The diagnostic mode in a VSC/SOP is operable throughout fault conditions since the operation is carried out through IGBT switch operation. This eliminates the need for shots.
2) Reduction of network downtime: The operation of diagnostic mode directly translates to an improvement in the restoration time and consequently reduces the time the feeder is disconnected from the rest of the electricity distribution network.
3) Flexibility to choose restoration time: The pre-set time for permanent fault may be optimized to best suit the requirements of the network operator. Selection of the restoration time is no longer associated with the asset degradation.
4) Longer operation life of existing assets: The assets are predominantly operated within the normal operational limit in the diagnostic mode. Therefore the degradation of assets due to repeated exposure to fault current is eliminated.
5) Elimination of repeated voltage sag on adjacent networks: There is no stress on the adjacent feeder or on the SOP through the restoration process since the SOP operates within normal limits, and without repeated shots.

It is described above that the VSC 12 is connected at the end of a feeder, however, in an alternate embodiment, the VSC 12 could be connected at any point along the feeder. This embodiment would require extra feeder isolation devices while the VSC 12 is in a diagnostic mode, to ensure a single path to a fault.

The VSC 12 draws power from the DC link 16 in order to perform its operations in the power control, diagnostic and restoration modes. In an alternative embodiment, the VSC 12 does not have to be part of a SOP 10, as long as the VSC 12 is connected to suitable DC supply of some sort.

As described above, the controller 28 not only synthesises the drive signals 27 that control the IGBTs 3, 4, 5, 6, 7 and 8 to operate the VSC 12 in the power control, diagnostic and restoration modes, but also carries out the necessary analytic processing of the voltage and current measurements obtained by sensors 23 and 24 in order to determine the continuing presence, type and location of a fault. In other embodiments, some or all of this analytic processing is done outside the SOP 10 in another computer or processor, to which one or more of the voltage and current measurements, or one or more values synthesised therefrom, have been sent. Such a variant is shown, at a high level, in FIG. 7.

Figure 7:
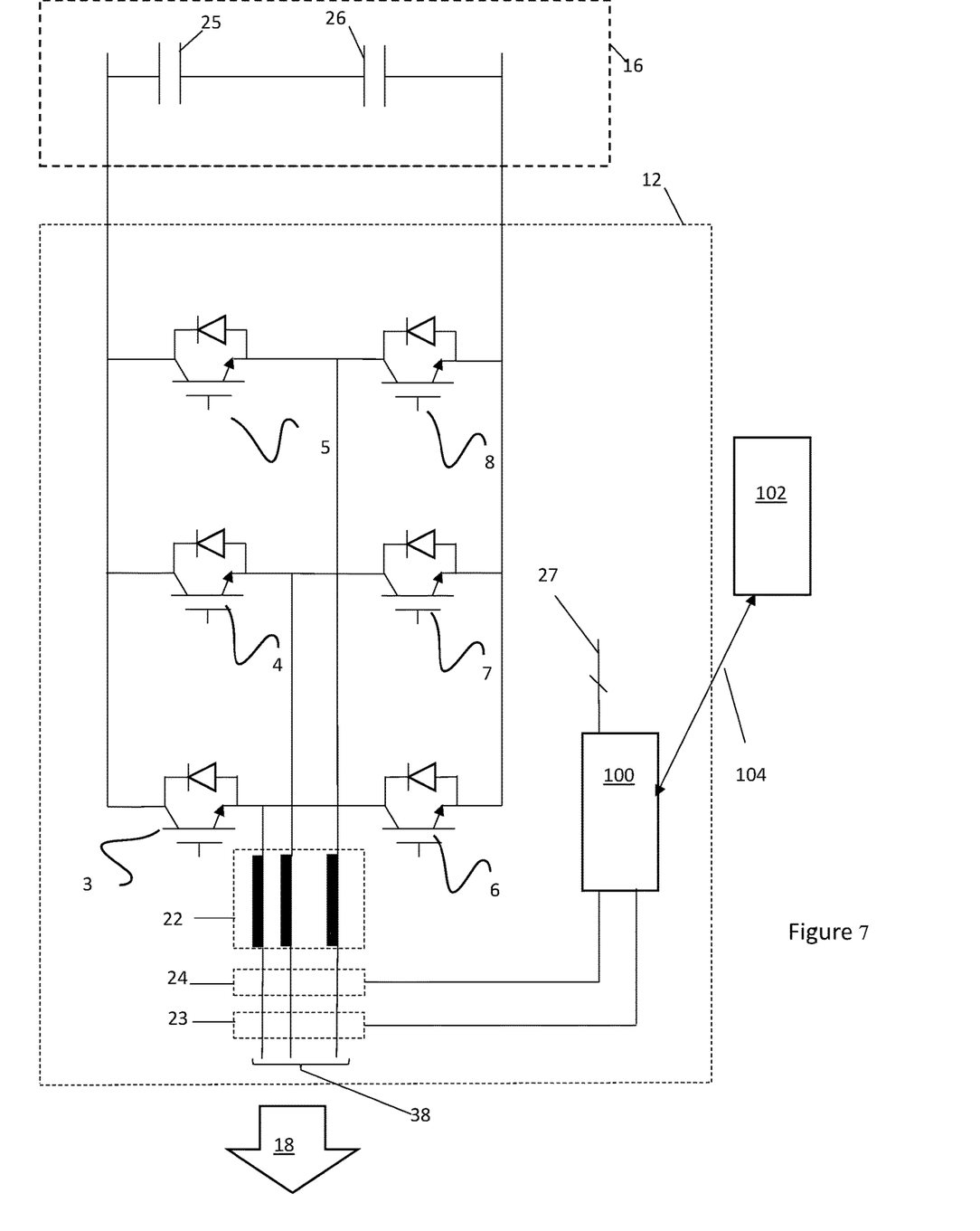
FIG. 7 illustrates a variant of the SOP shown in FIG. 2.

In the VSC shown in FIG. 7, features carried over from VSC 12 of FIG. 2 retain the same reference numerals. In FIG. 7, the functionality of the controller 28 of FIG. 2 has been divided between internal controller 100 and external controller 102, which communicate via connection 104. Connection 104 could, for example, be a cable directly connecting the controllers 100 and 102. Alternatively or connection 104 could be a logical connection, fulfilled physically via a telecommunications network and/or the internet. Internal controller 100 receives current and voltage measurements from the sensors 23 and 24 and processes them to make any feedback adjustments to the drive signals 27 that may be required for the SOP to perform correctly in whichever of the power control, diagnostic and restoration modes the SOP is currently operating. The current and voltage measurements from the sensors 23 and 24 collected by the internal controller 100 are also communicated to the external controller 102 via the connection 104. The external controller 104 carries out the aforementioned diagnostic-mode analytic processing to determine the continuing presence, location and type of feeder fault.

It is to be understood that although the foregoing description has been described with reference to one or more preferred embodiments, it will be appreciated that it is intended to illustrate and not to limit the scope of the invention, such that various changes or modifications may be made without departing from the scope of the invention which is defined by the appended claims. Other embodiments are within the scope of the following claims.

The invention claimed is:

1. A soft open point (SOP) for an AC electricity distribution network comprising a first and second voltage source converters (VSCs), and a DC link connecting the two VSCs, wherein:
   in a power control mode, each VSC is configured to apply voltage corrections to a respective AC feeder of the AC electricity distribution network while the AC feeders are operating normally;
   the first VSC is configured to, when a first AC feeder connected to the first VSC is faulty, cease supplying an AC voltage to the first AC feeder until the first VSC detects that a fault on the first AC feeder is isolated from the AC electricity distribution network and operate in a diagnostic mode to apply a diagnostic AC voltage to the first AC feeder and make current and voltage measurements at a connection of the first VSC to the first AC feeder while the diagnostic AC voltage is being applied when the fault is isolated from the AC electricity distribution network, wherein the diagnostic mode is used to continuously determine whether the fault remains present; and in the diagnostic mode, if the fault resolves itself within a pre-defined duration, the first VSC changes an operational state to the power control mode.

2. The SOP of claim 1, wherein, the first VSC is configured to generate the diagnostic AC voltage from a DC voltage applied to the DC link, and the second VSC is configured to generate the DC voltage from a voltage picked up from a second AC feeder to which the second VSC is operatively coupled.

3. The SOP of claim 1, further comprising one or more processors configured to do one or more of:

determining from the measurements the presence of the fault on the first AC feeder;

estimating from the measurements and a per-unit-length impedance or resistance of the first AC feeder the distance along the first AC feeder from the point of application of the diagnostic AC voltage to the fault along the first AC feeder; and determining from the measurements the type of the fault on the first AC feeder, wherein the type of the fault comprises at least one of: a line-to-ground fault; a line-to-line fault; and a three-phase fault.

4. The SOP of claim 3, wherein the one or more processors are arranged to, in response to determining that the fault has cleared, send a command for a feeder isolation device to close.

5. The SOP of claim 3, wherein the one or more processors are arranged to, in response to determining that the fault persists a predetermined time after being detected, send a command for a feeder isolation device to open.

6. The SOP according to claim 1, wherein the diagnostic AC voltage is an attenuated version of a feeder voltage under normal operating conditions.

7. A system, comprising:

a SOP for an AC electricity distribution network comprising a first and second voltage source converters (VSCs), and a DC link connecting the two VSCs, wherein, in a power control mode, each VSC is configured to apply voltage corrections to a respective AC feeder of the AC electricity distribution network while the AC feeders are operating normally; and the first VSC is configured to, when a first AC feeder connected to the first VSC is faulty, cease supplying an AC voltage to the first AC feeder until the first VSC detects that a fault on the first AC feeder is isolated from the AC electricity distribution network and operate in a diagnostic mode to apply a diagnostic AC voltage to the first AC feeder and make current and voltage measurements at a connection of the first VSC to the first AC feeder while the diagnostic AC voltage is being applied when the fault is isolated from the AC electricity distribution network, wherein the diagnostic mode is used to continuously determine whether the fault remains present, and in the diagnostic mode, if the fault resolves itself within a pre-defined duration, the first VSC changes an operational state to the power control mode; and one or more processors;

wherein the one or more processors are configured to do at least one of:

estimating from the measurements and a per-unit-length impedance or resistance of the first AC feeder the distance along the first AC feeder from the point of application of the diagnostic AC voltage to the fault along the first AC feeder;

determining from the measurements the type of the fault on the first AC feeder; and determining from the measurements the presence of the fault on the first AC feeder.

8. The system of claim 7, wherein the one or more processors are arranged to, in response to determining that the fault is of a temporary type, send a command for a feeder isolation device to close.

9. The system of claim 7, wherein the one or more processors are arranged to, in response to determining that the fault is of a permanent type, send a command for a feeder isolation device to open.

10. A method of fault assessment for an AC feeder in an AC electricity distribution network, the method comprising:

ceasing to supply the AC feeder with a voltage correction from a voltage source converter, VSC, of a soft open point (SOP) until the VSC detects that a fault on the AC feeder is isolated from the AC electricity distribution network;

when the fault is isolated from the AC electricity distribution network:
generating a diagnostic AC voltage with the VSC;
applying the diagnostic AC voltage to the AC feeder;
making at least one voltage measurement at a connection of the VSC to the AC feeder;
making at least one current measurement at the connection of the VSC to the AC feeder; and
determining at least one characteristic of the fault on the AC feeder from the measurements.

11. The method of claim 10, wherein determining at least one characteristic comprises at least one of:

calculating from the voltage and current measurements the distance along the first AC feeder from the point of application of the diagnostic AC voltage to the fault along the AC feeder;

determining from the voltage and current measurements the type of the fault; and determining from the measurements the continuing presence of a fault on the first AC feeder.

12. The method of claim 10, further comprising:
determining from the voltage and current measurements that the fault has cleared; and
sending a command for a feeder isolation device to close.

13. The method of claim 10, the method further comprising:

determining from the voltage and current measurements that the fault has not cleared within a predetermined period of being detected; and sending a command for a feeder isolation device to open.

14. The method of claim 10, wherein when the fault is detected on the AC feeder, ceasing to supply the AC feeder with the voltage correction from the VSC of the SOP until the fault is isolated from the AC electricity distribution network; and generating the diagnostic AC voltage with the VSC, when the fault is isolated from the AC electricity distribution network.

15. The method of claim 10, wherein the diagnostic AC voltage is an attenuated version of a feeder voltage under normal operating conditions.

16. A voltage source converter (VSC) for connection to an AC feeder in an AC electricity distribution network, the VSC being configured to, when the AC feeder connected to the VSC is faulty:
  cease supplying an AC voltage to the AC feeder until the VSC detects that the fault on the AC feeder is isolated from the AC electricity distribution network;
  operate in a diagnostic mode to apply a fixed diagnostic AC voltage to the AC feeder and make current and voltage measurements at the connection of the VSC to the AC feeder while the fixed diagnostic AC voltage is being applied when the fault is isolated from the AC electricity distribution network, wherein the diagnostic mode is used to continuously determine whether the fault remains present; and
  in the diagnostic mode, if the fault resolves itself within a pre-defined duration, then the VSC changes an operational state to a power control mode, wherein, in the power control mode, the VSC is configured to apply voltage corrections to the AC feeder while the AC feeder is operating normally.

17. The VSC according to claim 16,
  wherein the VSC is further configured to apply the fixed diagnostic AC voltage and make current and voltage measurements, when the fault is isolated from an AC electricity distribution network.

18. A voltage source converter, VSC, for connection to an AC feeder in an AC electricity distribution network, the VSC comprising a voltage source configured to produce an output voltage, current and voltage sensors, and a controller configured to adjust electrical parameters of the output voltage, wherein the controller is configured to, when the AC feeder connected to the VSC is faulty, cease supplying an AC voltage to the AC feeder until the VSC detects the fault on the AC feeder is isolated from the AC electricity distribution network, direct the voltage source to apply a fixed diagnostic AC voltage to the AC feeder when the fault is isolated from the AC electricity distribution network, and make current and voltage measurements at the connection of the VSC to the AC feeder via the sensors while the fixed diagnostic AC voltage is being applied.

19. The VSC according to claim 18, wherein
  wherein the controller is further configured direct the voltage source to apply the fixed diagnostic AC voltage and make current and voltage measurements, when the fault is isolated from the AC electricity distribution network.

* * * * *